United States Patent [19]

Kondo

[11] Patent Number: 4,918,662

[45] Date of Patent: Apr. 17, 1990

[54] SEMICONDUCTOR MEMORY DEVICE HAVING REDUNDANT STRUCTURE FOR SEGMENTED WORD LINE ARRANGEMENT

[75] Inventor: Kenji Kondo, Tokyo, Japan

[73] Assignee: NEC Corporation, Tokyo, Japan

[21] Appl. No.: 174,469

[22] Filed: Mar. 28, 1988

[30] Foreign Application Priority Data

Mar. 27, 1987 [JP] Japan .................................. 62-74905

[51] Int. Cl.[4] .................... G11C 17/00; G11C 29/00
[52] U.S. Cl. .................. 365/210; 365/230.03; 365/200
[58] Field of Search ............. 365/189.03, 230.03, 365/210, 200.1

[56] References Cited

U.S. PATENT DOCUMENTS

| | | | |
|---|---|---|---|
| 4,491,858 | 1/1985 | Kawamoto | 365/210 |
| 4,542,486 | 9/1985 | Anami et al. | 365/230 X |
| 4,554,646 | 11/1985 | Yoshimoto et al. | 365/189 X |
| 4,703,453 | 10/1987 | Shinoda et al. | 365/210 |
| 4,731,761 | 3/1988 | Kobayashi | 365/230 X |
| 4,747,083 | 5/1988 | Nakajima et al. | 365/230 X |
| 4,748,349 | 5/1988 | McAlexander et al. | 365/230 X |

Primary Examiner—Stuart N. Hecker
Assistant Examiner—Alfonso Garcia
Attorney, Agent, or Firm—Sughrue, Mion, Zinn, Macpeak & Seas

[57] ABSTRACT

A semiconductor memory device having a redundant structure for segmented word line arrangement is disclosed. The memory device comprises a plurality of memory blocks, each of the memory blocks having a plurality of normal segment word lines in normal rows coupled to normal memory cells and at least one redundant segment word line in a redundant row coupled to redundant memory cells, a normal row decoder circuit selecting one of the normal rows, a redundant row decoder for selecting the redundant row, a block selection circuit selecting one of the memory blocks and a plurality of normal control gates provided for the normal word lines and a plurality redundant control gates. One of the normal control gates is enabled to select the associated normal segment word line by the normal decoder circuit and the block selection circuit when the output of the redundant row decoder is not selected, and one of the redundant control gates is enabled to select the associated segment redundant word line when the output of the redundant row decoder is selected.

11 Claims, 4 Drawing Sheets

SEMICONDUCTOR MEMORY DEVICE HAVING REDUNDANT STRUCTURE FOR SEGMENTED WORD LINE ARRANGEMENT

BACKGROUND OF THE INVENTION

The present invention relates to a semiconductor memory device fabricated on a semiconductor substrate, and more particularly to a semiconductor memory device having a redundant array of memory cells.

In order to save a semiconductor memory having a small number of defective memory cells, and to thereby to improve production yields, the redundant technique has been proposed. In the redundant technique, a redundant memory cell array is provided for a normal memory cell array, and a defective memory cell or cells in the normal memory cell array are substituted by good memory cells in the redundant memory cell array. For when substituting the defective memory cell in the normal memory cell array by the good cell in the redundant memory cell array, normal operation address decoders are inhibited when a redundant address decoder selects or designates a good cell in the redundant memory cell array. The above inhibition of operation of the normal address decoders is achieved by applying the selection output signal of the redundant address decoder to the normal address decoders as an inhibition signal. However, the number of the normal address decoders such as row decoders is very large in the recent large capacity semiconductor memory device, and therefore the above selection output must be applied to a large number of address decoders. Therefore, load capacitance of the selection output signal of the redundant address decoder is very large, and therefore the normal address decoders cannot recognize the occurrence of the selection output signal of the redundant address decoder at a high speed but must wait for a certain delay time. Thus, the normal address decoders are controlled to be enabled a predetermined time after the operation of the redundant address decoder. Accordingly, the conventional semiconductor memory device provided with the redundant scheme is not suitable for high speed utilization.

SUMMARY OF THE INVENTION

It is an object of the present invention to provide a semiconductor memory device of the redundant type which can operate at a high speed.

The semiconductor memory device according to the present invention comprises a plurality of memory blocks each having a plurality of normal segment word lines, at least one redundant segment word line in rows common to other memory blocks, and a plurality of memory cells coupled to the normal and redundant segment word lines; a plurality of first control word lines extending through the memory blocks in the respective rows; at least one second control word line extending through the memory block in the row; a plurality of first decoders provided for the first control word lines; at least one second decoder provided for the at least one control word line; a plurality of first block control lines each provided for each of the memory blocks; a plurality of second block control lines each provided for each of the memory blocks; a plurality of first selection circuits each coupled to one of the first control word lines, one of the first block control lines and one of the normal segment word lines, each of the first selection circuits selecting the normal segment word line coupled thereto when both of the one first control word line and the one first block control line coupled thereto take their active levels; a plurality of second selection circuits, each coupled to the one second control word line, one of the second block control lines and one of the redundant segment word lines, each of the second selection circuits selecting the associated redundant segment word line when both of the associated second control word line and the associated second block control line take their active level, and a control circuit coupled to the first and second block control lines for activating one of the first block control lines when the at least one second control word line is not made at the active level and deactivating all of the first block control lines when the at least one second control word line is made active.

According to the present invention, the conventional lengthy normal and redundant word lines are split into a plurality of short normal and redundant segment word lines, and the first normal word line decoders for selecting one of the first control word lines operate simultaneously with the second, redundant word line decoder. As a result, the memory device according to the invention can operate at a high speed.

DETAILED DESCRIPTION OF THE INVENTION

Figure 1:
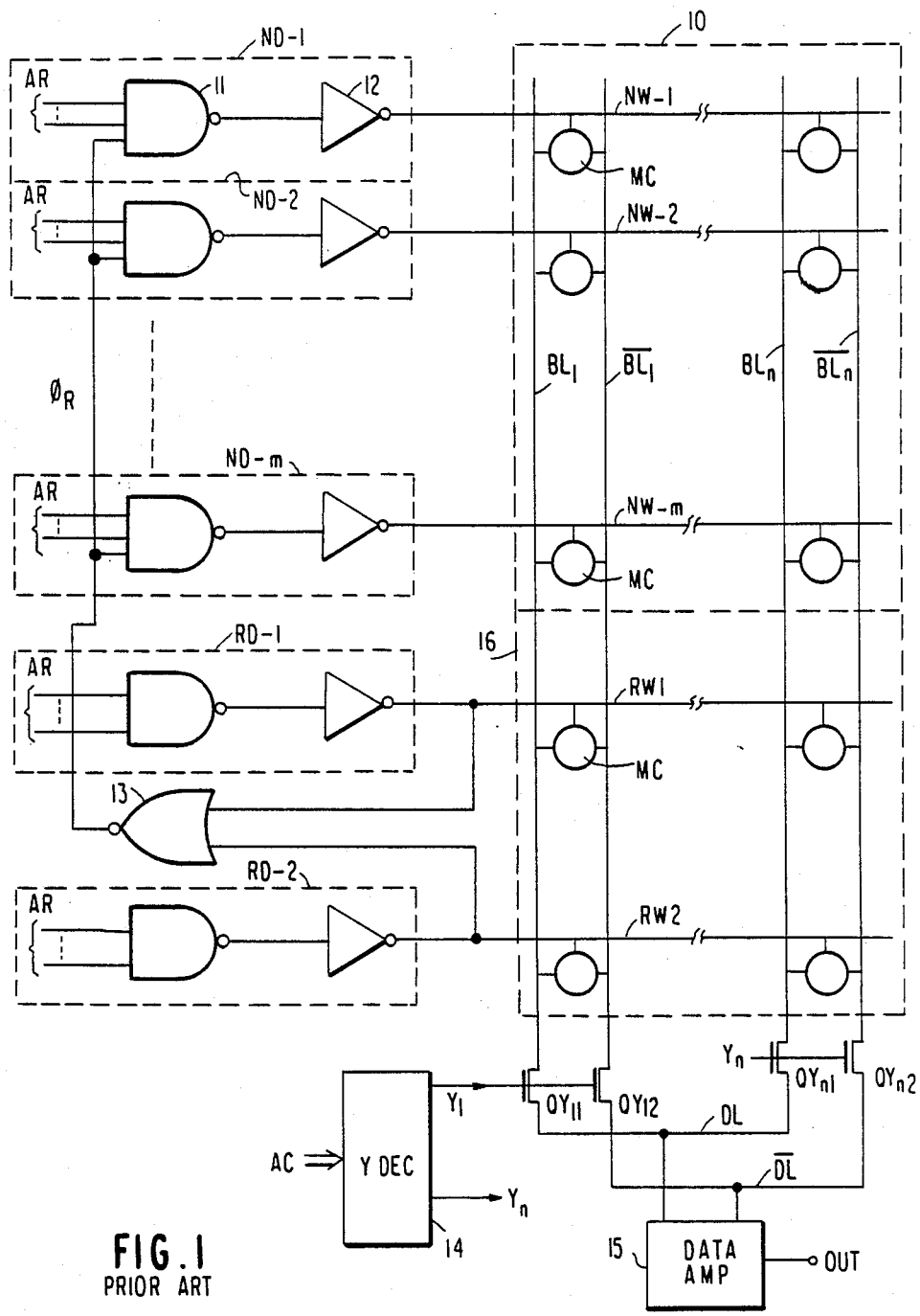
FIG. 1 is a schematic block diagram of a conventional semiconductor memory device.

With reference to FIG. 1, a conventional redundant type semiconductor memory device will be explained. A normal memory cell array 10 includes a plurality of static type memory cells MC each made of flip-flop coupled to normal word lines NW-1 to NW-m in rows and a plurality pairs of bit lines BL1, $\overline{BL}$1 to BLn, $\overline{BL}$n in columns. A redundant memory cell array 16 includes a plurality of memory cells MC coupled to redundant word lines RW1, RW2 arranged in rows and the pairs of bit lines shared with the normal array 10. The normal word lines NW-1 to NW-m are connected to normal word line decoders ND-1 to ND-m, respectively. The redundant word lines RW1, RW2 are connected to redundant word line decoders RD1, RD2, respectively. Each of the normal decoders and the redundant decoders includes a NAND gate receiving row address signals AR in a predetermined combination and an inverter 12. The outputs of the redundant decoders RD-1 and RD-2 are applied to inputs of a NOR gate 13 whose output is applied, as an inhibition signal $\phi_R$, to the inputs of the NAND gates 11 of the respective normal decoder ND-1 to ND-m. When one of the redundant word lines is selected, the NOR gate produces a low level of the signal $\phi_R$ so that the outputs of all the normal decoders are forcibly set at a low, non-selection level. While, when the redundant word lines RW-1 and RW-2 are all in a non-select state, all the redundant word lines RW-1 and RW-2 are at a low non-selection level, while the signal $\phi_R$ is at a high level, so that the normal word line decoders ND-1 to ND-m are enabled to select in accordance with the row address signals. On the other hand, when one of the redundant word lines RW-1 and RW-2 are selected, the signal $\phi_R$ is shifted to a low level to cause all the normal word line decoders ND-1 to ND-m are inactivated, so that all the normal word lines NW-1 to NW-m are brought into a non-select state.

A column decoder receives column address signals AC and selects one pair of column selection transistors $QY_{11}$, $QY_{12}$-$QY_{n1}$, $QY_{n2}$ in a known manner so that a selected pair of bit lines are electrically connected to a pair of data lines DL, $\overline{DL}$ which are connected to a pair of input terminals of a data output amplifier 15.

In the above-described conventional word line substitution type redundant circuit, the signal $\phi_R$ is input to all the normal word line decoders ND-1 to ND-m and therefore the load which must be driven by the signal $\phi_R$ is large. Accordingly, when a redundant word line is selected, a normal word line may be undesirably selected before the normal word line decoders are inactivated in response to the signal $\phi_R$, resulting in multi-selection of both a redundant and normal word lines.

Figure 2:
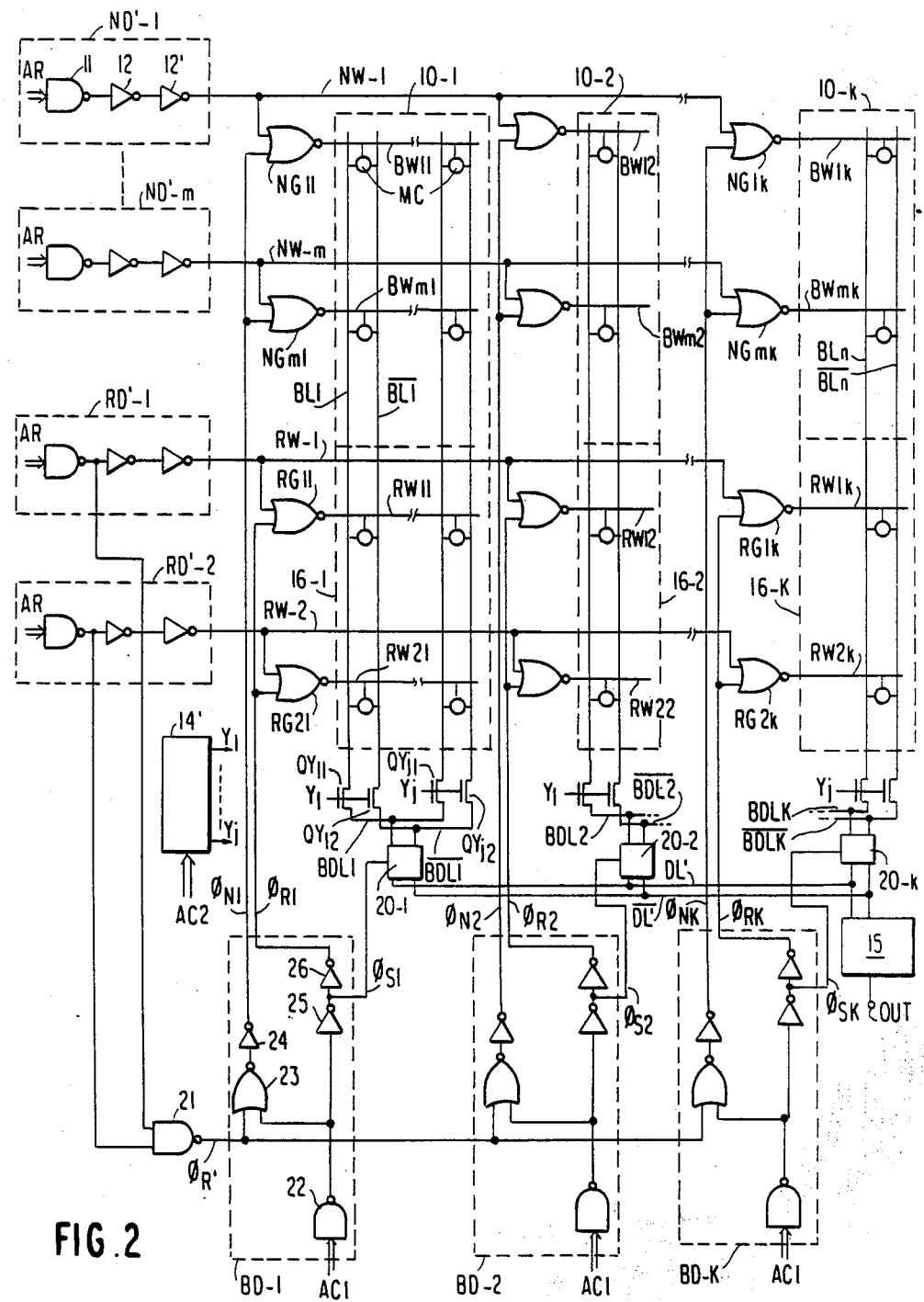
FIG. 2 is a schematic block diagram of a semiconductor memory device according to a first embodiment of the present invention.

Referring to FIG. 2, a semiconductor memory device according to a first embodiment of the present invention will be explained.

The normal memory cell array 10 in FIG. 1 is divided into a plurality of normal sub-arrays 10-1 to 10-K (K being favorably smaller than m) and the redundant array 16 in FIG. 1 is also divided into a plurality of redundant subarrays 16-1 to 16-K. Normal segment word lines $BW_{11}$ to $BW_{m1}$ are arranged in rows and j pairs of bit lines BL1, $\overline{BL1}$ to BLj, $\overline{BLj}$ are arranged in columns in the normal sub-array 10-1. The numbers "j" and "K" have the relation of "j"×"K"="n" (n is the number of the bit line pairs in FIG. 1). Other normal sub-arrays 10-2 to 10-K have the same arrangement of memory cells MC, "m" of normal segment word lines and "j" pairs of bit lines.

The redundant sub-array 16-1 includes redundant segment word lines RW11 and RW12, "j" pairs of bit lines BL1, $\overline{BL1}$-BLj, $\overline{BLj}$ and memory cells. Other redundant sub-arrays 16-2 to 16-K have the same arrangement as the redundant sub-array 16-1. The normal segment word lines BW11 to BWm1 in the sub-array 10-1 are connected to outputs of NOR gates NG11 to NG1m, respectively. The NOR gates NG11-NG1m have their first inputs connected to control normal word lines NW-1 to NW-m connected to normal word line decoders ND'-1 to ND'-m, respectively while second inputs of the NOR gates NG11 to NG1m receive a block enable signal $\phi_{N1}$ generated from a block decoder BD-1.

The redundant segment word lines RW11 and RW21 in the redundant sub-array 10-1 are connected to outputs of NOR gates RG11 and RG21. First inputs of the NOR gates RG11 and RG21 are connected to control redundant word lines RW-1 and RW-2 which are driven by the redundant word line decoders RD'-1 and RD'-2, respectively. Second inputs of the NOR gates RG11 and RG21 are supplied with a block redundant enable signal $\phi_{R1}$ from the block decoder BD-1. Other normal segment word lines and the redundant word lines in other sub-arrays are similarly arranged, as illustrated.

The block decoder BD-1 includes a NAND gate receiving a first part of column address signals (AC1) in a predetermined combination, a NOR gate 23 receiving the output signal of the NAND gate 22 and a control signal $\phi_R'$ generated from a NAND gate 21, inverters 24 to 26. The block decoder BD-1 operatively determines whether or not either the normal sub-array 10-1 or the redundant sub-array 16-1 is to be selected.

Figure 4:
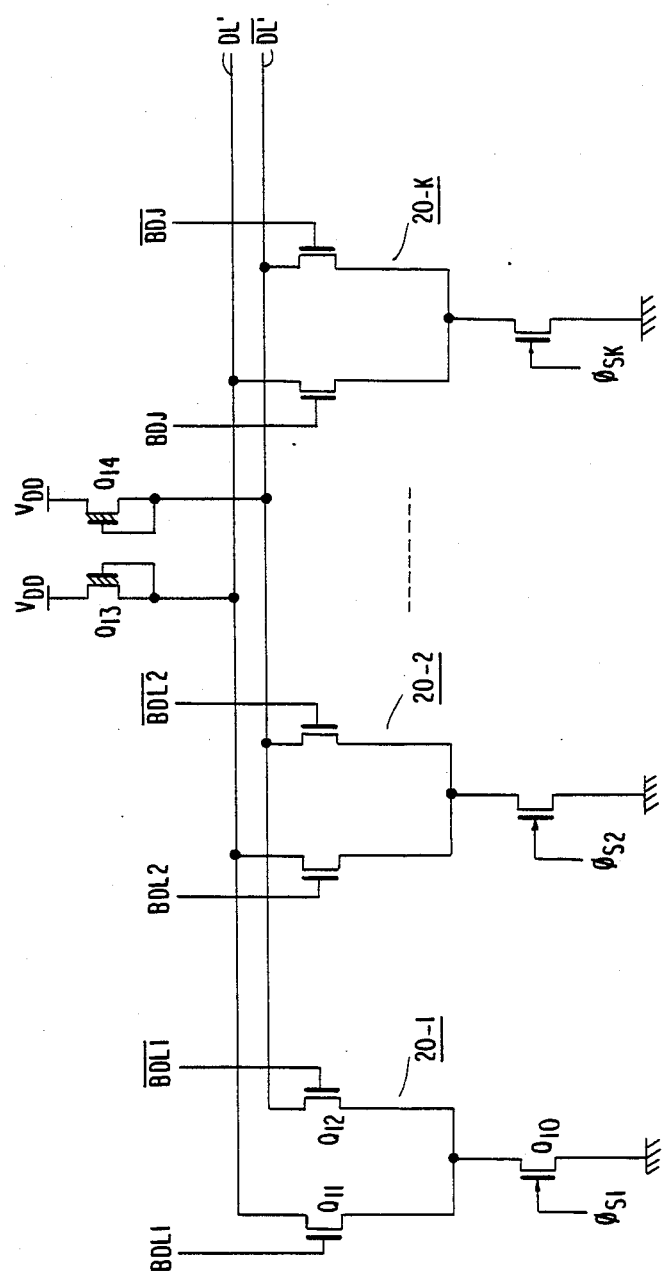
FIG. 4 is a schematic circuit diagram of block gated amplifiers employed in the memory devices in FIGS. 2 and 3.

In this embodiment, the selection level of the control normal word lines NW-1 to NW-m and the control redundant word lines is the low (ground) level. Also, the active, selection levels of the signals $\phi_{N1}$-$\phi_{NK}$, $\phi_{R1}$-$\phi_{RK}$ are the low level. The block decoders BD-1 to BD-K also produce sense control signals $\phi_{S1}$ to $\phi_{SK}$ which are applied to block sense amplifiers 20-1 to 20-K. The active level of the sense control signal is the high ($V_{DD}$) level and one of the block sense amplifiers provided for the selected sub-array is enabled by the active level of the sense control signal thereto so that the read-out data from the selected sub-array is produced on the data lines DL' and $\overline{DL'}$. The column decoder 14' receives a second part of the column address signals (AC2) and produces "j" column decode signals Y1-Yj. The column decode signals Y1-Yj are applied to the pairs of transfer gates QY11, QY12-$QY_{j1}$, $QY_{j2}$ for the respective sub-arrays so that the selected pair of bit lines are electrically connected to a pair of block data lines BDL1, $\overline{BDL1}$. Since the number of transfer gates $QY_{j1}$, $QY_{j2}$ connected to the respective block data lines is made small by the factor of "K" as compared to the case of FIG. 1, a read-out signal on the selected pair of bit lines is rapidly transferred to the data output amplifier 15. As example of the arrangement of the block sense amplifier is shown in FIG. 4. The amplifier 20-1 includes a pair of input transistors $Q_{11}$ and $Q_{12}$ having gates coupled to BDL1 and $\overline{BDL1}$, respectively and an enabling transistor Q10 having a gate receiving $\phi_{S1}$. A pair of depletion transistors Q13 and Q14 serve as common load elements for the amplifiers 20-1 to 20-K. When the signal $\phi_{S1}$ is at the high level, the amplifier 20-1 is enabled and the state of DL' and $\overline{DL'}$ is determined by the levels of BDL1 and $\overline{BDL1}$.

Next, operation of the device of FIG. 2 will be explained.

First, the explanation will be made for the case where a memory cell in one of the normal sub-array is selected for reading, and particularly for the case where the memory cell connected to the segment normal word line BW11 and the pair of bit lines BL1, $\overline{BL1}$ are selected.

The row address signals applied to the NAND gate 11 of the normal word line decoder ND'-1 are all at a high level so that the control word line NW-1 is made at the selective, low level while the outputs of other normal word line decoders and the redundant word line decoders are at the non-selection, high level.

The column address signals (AC1) inputted to the NAND gate 22 of the block decoder BD-1 are all at the high level and the NAND gate 22 of the block decoder BD-1 produces the low level output. In this instance, all the redundant word line decoders RD'-1 and RD'-2 are in the non-selection state to produce the high, non-selection level. Therefore, the NAND gate 21 generates the low level of the control signal $\phi_R'$. As a result, both inputs of the NOR gate 23 of the block decoder BD-1 are at the low level and the signal $\phi_{N1}$ is rendered the active, low level. The signals $\phi_{R1}$ and $\phi_{S1}$ are at the low level and the high level, respectively. Therefore, the normal segment word line BW11 is selected by the NOR gate NG11. Meanwhile, other normal segment word lines and the redundant segment word lines are non-selected. Thus, data stored in the memory cells coupled to BW11 appear at the bit lines in the sub-array 10-1.

In response to the column address signals (AC2), the column decoder 14' makes the output Y1 at the selective, high level with others $Y_2$- $Y_j$ the non-selection, low level. Accordingly, the pair of bit lines BL1, $\overline{BL}_1$ are electrically connected to the pair of block data lines $BDL_1$, $\overline{BDL}_1$ and the data at BL1, $\overline{BL}_1$ is transferred to the inputs of amplifier 20-1 enabled by the high level of $\phi_{S1}$. Thus, the read-out signal is amplified by the amplifier 20-1 and further amplified by the data output amplifier 15 for external read-out at the output terminal OUT.

Second, the explanation will be made on the case where a memory cell in one of the redundant sub-arrays, particularly the memory cell connected to the redundant segment word line RW21 and the pair of bit line BL1, $\overline{BL1}$ in the redundant sub-array 16-1, is selected.

The row address input signals applied to the NAND gate of the redundant word line decoder RD'-2 are all at the high level so that the control redundant word line RW-2 is made at the selection, low level. The non-selected normal word line decoders ND'-1 to ND'-m and the other non-selected redundant word line decoder RD'-1 produce the non-selection, high level outputs.

In this instance, one of the normal word line decoders ND'-1 to ND'-m produces the low, selection level of output. Since the output of the NAND gate 11 of RD'-2 is at the low level, the NAND gate 21 produces the high level output so that the selected block decoder BD-1 produces the high level of the signal $\phi_{N1}$ with the low, active level of $\phi_{R1}$ and the high, active level of $\phi_{S1}$. Therefore, the outputs of the NOR gates $NG_{11}$–$NG_{m1}$ for the normal sub-array 10-1 are forcibly set at the non-selection, high level. Therefore, only the NOR gate RG21 produces the high, selection output signal so that the memory cells coupled to the redundant segment word line RW21 are addressed.

Then, the signal between the pair of bit lines BL1, $\overline{BL}_1$ is transferred to $BDL_1$, $\overline{BDL}_1$ via $QY_{11}$ and $QY_{12}$ and amplified by the enabled amplifier 20-1 in the similar manner as the above explained operation.

According to this embodiment, in place of lengthy conventional word lines, normal and redundant segment word lines are employed and therefore the capacitance loaded to the respective segment word lines is small. Also, the pair of block data lines are provided for the respective sub-arrays and therefore, the read-out signal between the selected pair of bit lines is amplified at a high speed via the block amplifier.

When the redundant word line decoder is selected, any selection of the outputs of the NOR gates such as NG11–NG1m is inhibited by the output such as $\phi_{N1}$ of the block decoder, in place of inhibiting the normal word line decoder. As a result, the normal word line decoders can operate simultaneously with the redundant word line decoder without waiting for the operation of the redundant decoders. Thus, the selection of the memory cell can be achieved at high speed.

Figure 3:
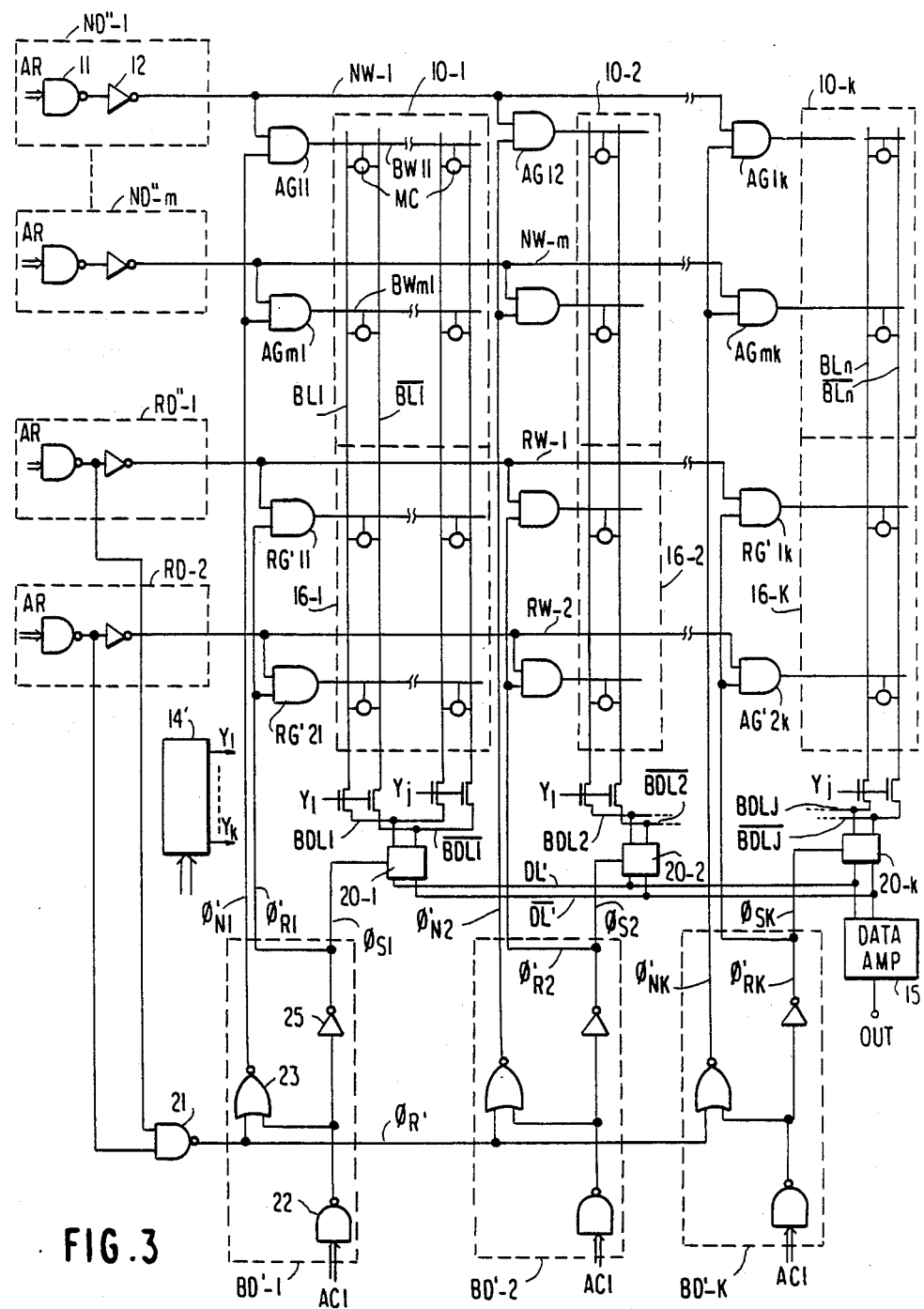
FIG. 3 is a schematic block diagram of a semiconductor memory device according to a second embodiment of the present invention.

Referring to FIG. 3, a memory device according to a second embodiment of the invention is explained. In FIG. 3, the portions or elements corresponding to those in FIG. 2 are designated by the same or similar references.

In the memory device of the second embodiment, the normal word line decoders ND''-1 to ND''-m and the redundant word line decoders RD''-1, RD''-2 produce the selection outputs of the high level and the non-selection level of the low level and the block decoders BD'-1 to BD'-K produce the active, high level of the signals $\phi'_{N1}$–$\phi'_{NK}$ and $\phi'_{R1}$–$\phi'_{RK}$. Thus, the phase relation of the outputs of the respective word line decoders and the block decoders is opposite with respect to the embodiment of FIG. 2. Accordingly, in place of NOR gates $NG_{11}$–$NG_{mK}$, $RG_{21}$–$RG_{2K}$, in FIG. 2, AND gates $AG_{11}$–$AG_{mK}$, $RG'_{21}$–$RG'_{2K}$ are employed in the second embodiment of the invention.

As has been described above, unlike the conventional redundant memory wherein the inhibition control signal which is generated when a redundant word line is selected is input to normal word line decoders, the present invention is arranged such that the control signal is input to block decoders for selecting sub-arrays which are formed by dividing memory cells into two or more memory cell groups. The number of block decoders is made smaller than the number of normal word line decoders to thereby reduce the load which must be driven by the control signal. Accordingly, the time required to generate a control signal when a redundant word line is selected is reduced, so that it is advantageously possible to prevent the occurrence of the erroneous operation that both a normal block word line and a redundant block word line are undesirably selected.

I claim:

1. A semiconductor memory device comprising a plurality of memory blocks each having a plurality of normal segment word lines, a plurality of normal memory cells coupled to said normal segment word lines, at least one redundant segment word line in rows common to other memory blocks, and a plurality of redundant memory cells coupled to said redundant segment word lines;

a plurality of first control word lines extending through said memory blocks in the respective rows;

at least one second control word line extending through said memory block in the row;

a plurality of first decoders provided for said first control word lines, the output of one of said first decoders being made at an active level to select the associated first control word line;

at least one second decoder provided for said at least one second control word line, the output of said second decoder being made at an active level to select the second control line coupled thereto when the selected first control line is associated with the normal memory cells including at least one defective normal memory cell;

a plurality of first block control lines each provided for each of said memory blocks;

a plurality of second block control lines each provided for each of said memory blocks;

a plurality of first selection circuits each coupled to one of said first control word lines, one of said first block control lines and one of said normal segment word lines, each of said first selection circuits selecting the normal segment word line coupled thereto when both of the one first control word line and the one first block control line coupled thereto take their active levels;

a plurality of second selection circuits, each coupled to the one second control word line, one of said second block control lines and one of said redundant segment word lines, each of said second selection circuits selecting the associated redundant segment word line when both of the associated second control word line and the associated second block control line take their active level, and a control circuit coupled to said first and second block control lines for activating one of said first block control lines when said at least one second control word line is not made at the active level and deactivating all of said first block control lines when said at least one second control word line is made active.

2. The memory device according to claim 1, in which each of said memory blocks includes a plurality of bit lines arranged in columns, a block data line, and a plurality of transfer gates coupled between said bit lines and said block data line.

3. The memory device according to claim 1, in which each of said first and second selection circuits includes a NOR gate.

4. The memory device according to claim 1, in which each of said first and second selection circuits includes a NAND gate.

5. The memory device according to claim 1, in which said selection circuit includes a plurality of block decoders each provided for each of said memory blocks, and a detection circuit for detecting the activation of said at least one second control word line, each of said block decoders including a multi-input first gate receiving a part of column address signals, a second gate receiving the outputs of said detection circuit and said first gate for generating the first block control signal.

6. A semiconductor memory device comprising a plurality of memory block pairs, each of said memory block pairs including a normal memory block and a redundant memory block, said normal memory block having a plurality of normal memory cells arranged in rows and columns and a plurality of normal segment word lines arranged in the rows and coupled to the normal memory cells, said redundant memory block including a plurality of redundant memory cells arranged in at least one row and the columns common to those of the normal memory block of the same memory block pair and at least one redundant segment word line arranged in said at least one row and coupled to the redundant memory cells, the redundant memory cells of said redundant memory block being used for replacing a defective normal memory cell or cells in the normal memory block of the same memory block pair, the rows of the respective normal memory cells of said memory block pairs being common, the at least one row of the respective redundant memory cells being common through said memory block pairs;
a plurality of normal control word lines provided for the rows of said normal memory cells;
at least one redundant control word line provided for the at least one row of the redundant memory cells;
a plurality of normal row decoders having output ends coupled to said normal control word lines, respectively, one of said normal row decoders being selected in accordance with row address information thereby to set the associated normal control word line at a selective level;
at least one redundant row decoder having an output end coupled to said at least one redundant control word line, said redundant row decoder being enabled to set said redundant control word line at a selective level when the normal control line set at the selective level is associated with at least one defective normal memory cell;
a plurality of block decoders provided for said plurality of memory block pairs, each of said block decoders having first and second output terminals, one of said block decoders being selectively enabled in accordance with block address information, the first output terminal of the enabled block decoder being made at a selective level at least when said redundant row decoder is enabled and the second output terminal of said enabled block decoder being made at a selective level only when said at least one redundant row decoder is not enabled;
a plurality of control blocks provided for said memory block pairs, each of said control blocks having a plurality of first control gates provided for the normal segment word lines of the associated memory block pair, each of said first control gates having a first input end coupled to the output end of the associated one of said normal row decoders, a second input end coupled to the second output terminal of the associated one of said block decoders, and an output end coupled to one of the normal segment word lines of the associated memory block pair, and at least one second gate having a first input end coupled to the output end of said at least one redundant row decoder, a second input end coupled to the first output terminal of the associated block decoder and an output end coupled to the associated redundant segment word line of said associated memory block pair, the output end of each of said first and second gates being selected when both of the first and second input ends thereof are set at the selective levels.

7. The memory device according to claim 6, in which each of said normal row decoders and said redundant row decoder includes a NAND gate receiving said row address information.

8. The memory device according to claim 6, in which each of said block decoders includes a NAND gate receiving said block address information, a buffer having an input end coupled to the output of said NAND gate and an output coupled to said first output terminal thereof.

9. The memory device according to claim 6, in which each of said first control gates includes a NOR circuit receiving the outputs of the associated block decoder and the associated normal row decoder.

10. The memory device according to claim 6, in which a pair of bit lines are arranged in each of the columns of the respective memory block pairs.

11. The memory device according to claim 6, further comprising a common data line, a plurality of column selection circuits provided for said plurality of memory block pairs, each of said column selection circuits selecting one of the columns of the associated memory block pair, and a block selection circuit connected between said common data line and said column selection circuits for selectively establishing a signal path between said common data line and one of said column selection circuits.

* * * * *

UNITED STATES PATENT AND TRADEMARK OFFICE
CERTIFICATE OF CORRECTION

PATENT NO. : 4,918,662

DATED : April 17, 1990

INVENTOR(S) : Kenji KONDO

It is certified that error appears in the above-identified patent and that said Letters Patent is hereby corrected as shown below:

Title page:

Abstract, line 15, delete "tbe" and insert --the--.

Col. 5, line 43, delete "BL1" and insert --$BL_1$--.

Signed and Sealed this

Twentieth Day of August, 1991

Attest:

Attesting Officer

HARRY F. MANBECK, JR.

Commissioner of Patents and Trademarks